US006577500B2

(12) United States Patent
Paredes et al.

(10) Patent No.: US 6,577,500 B2
(45) Date of Patent: Jun. 10, 2003

(54) WIRELESS PC CARD

(75) Inventors: Vladimir Paredes, San Jose, CA (US); Karch Polgar, San Jose, CA (US); Mark S. Smith, San Jose, CA (US)

(73) Assignee: 3Com Corporation, Santa Clara, CA (US)

( * ) Notice: Subject to any disclaimer, the term of this patent is extended or adjusted under 35 U.S.C. 154(b) by 138 days.

(21) Appl. No.: 09/795,506

(22) Filed: Feb. 28, 2001

(65) Prior Publication Data

US 2002/0118508 A1 Aug. 29, 2002

(51) Int. Cl.$^7$ .................................................. G06F 1/16
(52) U.S. Cl. ...................... 361/686; 361/683; 361/684; 439/131; 439/676
(58) Field of Search ................................ 361/683, 686, 361/684, 737, 783, 801, 820, 728–732, 785; 439/79, 76.1, 676, 638, 639, 946, 946.2, 945, 94, 101; 235/382, 441, 492, 444, 380, 375, 379; 273/498 B, 435

(56) References Cited

U.S. PATENT DOCUMENTS

| 2,916,720 A | 12/1959 | Steans | 339/91 |
| 3,205,471 A | 9/1965 | Herrmann | 339/176 |
| 4,186,988 A | 2/1980 | Kobler | 339/176 |

(List continued on next page.)

FOREIGN PATENT DOCUMENTS

| WO | WO 95/13633 | 5/1995 |

OTHER PUBLICATIONS

PCMCIA (Personal Computer Memory Card International Association), The Worldwide Organization for Modular Peripherals, "Frequently Asked Questions about P Card Technology," www.pc–card.com/faq.htm, pp. 1–5 (date unknown).

PCMCIA (Personal Computer Memory Card International Association), The Worldwide Organization for Modular Peripherals, "PC Card Technology Primer," www.pc–card.com/pcccard.htm, pp. 1–3 (date unknown).
PCI (Peripheral Component Interconnect), "PCI Overview Class or CD," www.winteltraining.com/comppci.htm, p.1 (1998).
IST Engineering, Ltd., Compact PCI Products for the OEM "About CompactPCT," www.iste.com/comppci.html, pp. 1–4 (date unknown).

(List continued on next page.)

Primary Examiner—Michael Datskovsky
(74) Attorney, Agent, or Firm—Workman, Nydegger & Seeley

(57) ABSTRACT

A wireless PC card for use in facilitating radio communications by a host computer in the context of a wireless computer network. The wireless PC card includes a housing conforming to a Type II PCMCIA form factor and having first and second extending portions which cooperatively define a recess configured and arranged to accommodate two RJ-type connector bodies of a Type III PC card. By virtue of its configuration and arrangement, the recess permits both the wireless PC card and a Type III PC card to simultaneously reside in a single Type III PC card slot of the host computer. Additionally, the recess is configured and arranged to permit removal of the Type III PC card from the Type III PC card slot, without also necessitating removal of the wireless PC card. Disposed within the housing are electronic circuitry and two antennae in communication with the electronic circuitry. One of each of the antennae is disposed in a respective extending portion. The extending portions of the housing facilitate the separation of the antennae that is necessary to optimal performance of the wireless PC card. Additionally, the plastic construction of the housing contributes to the durability and longevity of the antennae. Finally, a PCMCIA standard 68-socket connector in electrical communication with the electrical circuitry serves to physically and electrically connect the wireless PC card to the host computer.

26 Claims, 5 Drawing Sheets

U.S. PATENT DOCUMENTS

| | | | |
|---|---|---|---|
| 4,239,316 A | 12/1980 | Spaulding | 439/676 |
| 4,241,974 A | 12/1980 | Hardesty | 339/154 |
| 4,303,296 A | 12/1981 | Spaulding | 339/122 |
| 4,352,492 A | 10/1982 | Smith | 271/1 |
| 4,407,559 A | 10/1983 | Meyer | 339/126 |
| 4,428,636 A | 1/1984 | Kam et al. | 339/97 |
| 4,566,749 A | 1/1986 | Johnston | 339/95 D |
| 4,602,842 A | 7/1986 | Free et al. | 339/156 R |
| 4,647,136 A | 3/1987 | Kinoshita et al. | 339/125 R |
| 4,710,136 A | 12/1987 | Suzuki | 439/374 |
| 4,778,410 A | 10/1988 | Tanaka | 439/676 |
| 4,875,872 A | 10/1989 | Tanaka | 439/344 |
| 4,915,648 A | 4/1990 | Takase et al. | 439/490 |
| 4,934,947 A | 6/1990 | Brummans et al. | 439/77 |
| 5,035,641 A | 7/1991 | Van-Santbrink et al. | 439/329 |
| 5,051,099 A | 9/1991 | Pickles et al. | 439/108 |
| 5,139,439 A | 8/1992 | Shie | 439/359 |
| 5,183,404 A | 2/1993 | Aldous et al. | 439/55 |
| 5,184,282 A | 2/1993 | Kaneda et al. | 361/395 |
| 5,310,360 A | 5/1994 | Peterson | 439/571 |
| 5,336,099 A | 8/1994 | Aldous et al. | 439/131 |
| 5,338,210 A | 8/1994 | Beckham et al. | 439/131 |
| 5,364,294 A | 11/1994 | Hatch et al. | 439/676 |
| 5,391,083 A | 2/1995 | Roebuck et al. | 439/76 |
| 5,391,094 A | 2/1995 | Kakinoki et al. | 439/638 |
| 5,411,405 A | 5/1995 | McDaniels et al. | 439/131 |
| 5,425,660 A | 6/1995 | Weikle | 439/676 |
| 5,457,601 A | 10/1995 | Georgopulos et al. | 361/686 |
| 5,478,261 A | 12/1995 | Bogese, II | 439/676 |
| 5,481,616 A | 1/1996 | Freadman | 381/90 |
| 5,486,687 A * | 1/1996 | Le Roux | 235/382 |
| 5,499,923 A | 3/1996 | Archibald et al. | 439/26 |
| 5,505,633 A | 4/1996 | Broadbent | 439/329 |
| 5,509,811 A | 4/1996 | Homic | 439/55 |
| 5,513,074 A | 4/1996 | Ainsbury et al. | 361/737 |
| 5,528,459 A | 6/1996 | Ainsbury et al. | 361/737 |
| 5,538,442 A | 7/1996 | Okada | 439/676 |
| 5,547,401 A | 8/1996 | Aldous et al. | 439/676 |
| 5,561,727 A | 10/1996 | Akita et al. | 385/88 |
| 5,562,504 A | 10/1996 | Moshayedi | 439/638 |
| 5,580,274 A | 12/1996 | Tsair | 439/571 |
| 5,605,463 A | 2/1997 | MacGregor | 439/64 |
| 5,608,606 A | 3/1997 | Blaney | 361/686 |
| 5,608,607 A | 3/1997 | Dittmer | 361/686 |
| 5,613,860 A | 3/1997 | Banakis et al. | 439/64 |
| 5,619,396 A | 4/1997 | Gee et al. | 361/68 |
| 5,628,637 A | 5/1997 | Pecone et al. | 439/74 |
| 5,634,802 A | 6/1997 | Kerklaan | 439/131 |
| 5,637,001 A | 6/1997 | Nony et al. | 439/131 |
| 5,643,001 A | 7/1997 | Kaufman et al. | 439/159 |
| 5,655,918 A | 8/1997 | Soh | 439/159 |
| 5,660,568 A | 8/1997 | Moshayedi | 439/654 |
| 5,667,390 A | 9/1997 | Keng | 439/76.1 |
| 5,679,013 A | 10/1997 | Matsunaga et al. | 439/144 |
| 5,697,815 A | 12/1997 | Drewnicki | 439/638 |
| 5,716,221 A | 2/1998 | Kantner | 439/64 |
| 5,727,972 A | 3/1998 | Aldous et al. | 439/655 |
| 5,773,332 A | 6/1998 | Glad | 439/344 |
| 5,775,923 A | 7/1998 | Tomioka | 439/79 |
| 5,797,771 A | 8/1998 | Garside | 439/610 |
| 5,816,827 A | 10/1998 | Nelson et al. | 439/64 |
| 5,816,832 A | 10/1998 | Aldous | 439/131 |
| 5,847,932 A | 12/1998 | Kantner | 361/737 |
| 5,876,218 A * | 3/1999 | Liebenow et al. | 439/74 |
| 5,938,480 A | 8/1999 | Aldous et al. | 439/676 |
| 5,980,322 A | 11/1999 | Madsen et al. | 439/621 |
| 5,984,731 A | 11/1999 | Laity | 439/676 |
| 5,988,511 A | 11/1999 | Schmidt et al. | 435/492 |
| 5,989,042 A | 11/1999 | Johnson et al. | 439/131 |
| 6,005,774 A | 12/1999 | Chiba et al. | 361/737 |
| 6,033,240 A | 3/2000 | Goff | 439/131 |
| 6,116,962 A | 9/2000 | Laity | 439/676 |
| 6,173,405 B1 | 1/2001 | Nagel | 713/200 |
| 6,174,205 B1 | 1/2001 | Madsen et al. | 439/638 |
| 6,183,307 B1 * | 2/2001 | Latiy et al. | 439/676 |
| 6,217,351 B1 | 4/2001 | Fung et al. | 439/131 |
| 6,217,391 B1 | 4/2001 | Colantuono et al. | 439/676 |
| 6,266,017 B1 | 7/2001 | Aldous | 343/702 |
| 6,341,069 B1 * | 1/2002 | Torlotin | 361/737 |
| 6,456,496 B1 * | 9/2002 | Aldridge et al. | 361/737 |

OTHER PUBLICATIONS

PCMCIA (Personal Computer Memory Card International Association), The Worldwide Organization for Modular Peripherals, "SmartMedia Technology Primer," www.pc–card.com/smartmedia.htm, pp. 1–5 (date unknown).

PCMCIA (Personal Computer Memory Card International Association), The Worldwide Organization for Modular Peripherals, "Miniature Card Technology Primer," www.pc–card.com/miniaturecard.htm, pp. 1–6 (date unknown).

PCMCIA (Personal Computer Memory Card International Association), The Worldwide Organization for Modular Peripherals, "Multiple Function PC Cards," www.pc–card.com/papers/multifunc.htm, pp. 1–3 (date unknown).

P.E. Knight and D.R. Smith, "Electrical Connector for Flat Flexible Cable," IBM Technical Disclosure Bulletin, vol. 25, No. 1, Jun. 1982.

* cited by examiner

WIRELESS PC CARD

RELATED APPLICATIONS

The present application relates to co-pending U.S. patent application Ser. Nos. 09/795,505 (now issued as U.S. Pat. No. 6,447,306) entitled PC Card Configuration, and 09/795,169 entitled Multiple Form Factor PC Card System, both having been filed the same day herewith and both being incorporated herein in their respective entireties by this reference.

BACKGROUND OF THE INVENTION

1. The Field of the Invention

The present invention relates generally to electronic peripheral devices used to provide wireless communication functions to a host device. More particularly, embodiments of the present invention relate to an improved PC card that is physically configured to enhance wireless communication functions, and that provides an improved physical form factor.

3. The Relevant Technology

Advances in the power and sophistication of computer application software, operating systems, communications software, and peripheral devices have required the development of computers with greater processing speeds and capacities. At the same time however, the pressure to at least maintain, and preferably reduce, the physical size of the computer and its various components has increased as well. Accordingly, downsizing and miniaturization of computer components is an issue of great importance in the industry.

One result is the proliferation of miniaturized peripheral devices that can be interfaced with a computer device to provide additional functionality. One example of such peripheral devices is so-called "PC card" expansion component. These are miniaturized expansion cards that can be designed to provide a number of different functions. Examples of such PC cards include cards that provide additional memory; cards that provide for "wired" communications, such as modem cards and network interface cards; and cards that provide for wireless communication. The typical PC card is designed to plug into a port, slot, or socket of a host computing device. As a result, the small-sized PC card expands the functional capability of the host without increasing its size.

Expansion devices, such as PC cards, are typically built in accordance with prescribed physical and electrical standards, so as to insure compatibility between different manufacturers. For example, a number of manufacturers collaborated to form the Personal Computer Memory Card International Association (PCMCIA), which has published an industry standard for the physical design, dimensions, and electrical interface of PC cards. For example, PCMCIA standards provide for, among other things, Type I, Type II, and Type III form factors (hereinafter the "Type I," "Type II," and "Type III" standards, as applicable) wherein each form factor is characterized by specific dimensional and electrical attributes. Generally, the length and width characteristics of all PC cards conforming to PCMCIA standards are the same. More specifically, all PC cards conforming to such standards are 85.6 millimeters long and 54 millimeters wide. The distinguishing physical characteristic among the various PCMCIA form factors is the thickness of a particular PC card. In particular, Type I cards are 3.3 millimeters thick, Type II cards are 5.0 millimeters thick, and Type III cards are 10.5 millimeters thick.

The PCMCIA standard also defines the requisite electrical interface requirement for the PC cards and the host device. This includes a specified bus interface, and the host device must include at least one PC card slot, which includes at least one 68-pin electrical connector that is adapted to physically and electrically receive a PC card conforming to a PCMCIA electrical and physical standard.

In the PCMCIA slot configuration of many host devices, PC cards having dissimilar form factors, such as a Type II card and a Type III card, cannot simultaneously reside in adjacent PCMCIA slots, due to the increased proximity of the 68-pin connectors and the height profile of the Type III card. This can limit a user's ability to utilize multiple PC cards. For example, a "combo" PC card that provides "wired" communications—such as modem and LAN communications—may have integrated RJ—modular receptacles (e.g., RJ-11, RJ-45) that present a card height similar to a Type III thickness. Until now, the presence of such a card could preclude the simultaneous use of another Type II card, such as one that provides for wireless communications, in an adjacent slot. In this situation, the user must first physically remove the Type III card, and then insert the Type II card. Obviously, this is inconvenient, time consuming, and limits the functionality available to the host device at any given time.

The ability to utilize adjacent expansion cards is further limited when one of the cards requires a particular physical configuration—such as a PC card providing wireless communication functions. For example, if a card is residing in an adjacent slot, its presence may limit the ability to provide optimal antenna separation in a wireless PC card. In general, wireless PC card performance increases with antennae separation, so as to reduce so-called "dead spots" of a wireless signal. Accordingly, where the antennae are disposed relatively close to each other, the effectiveness of the wireless PC card can be impaired. Furthermore, optimally the antennae should protrude from the front face of the host computer in order to be most effective. These and other objectives are difficult to achieve within the physical confines of a particular standard such as the PCMCIA. Moreover, the problems are exasperated when another PC card is positioned within an adjacent slot.

In view of the foregoing problems and shortcomings, and others, with existing wireless PC cards, it would be an advancement in the art to provide a wireless PC card that facilitates wireless communications between the host computer and a wireless access point of the computer network, and that provides for optimized separation of the antennae elements so as to maximize the performance and reliability of the wireless computer network. Furthermore, the wireless PC card should be configured so that it uses, or otherwise occupies, only a single 68-pin connector in a PC card slot of a host computer. Additionally, the wireless PC card should have a geometry that permits simultaneous use of the wireless PC card, and another PC card in an adjacent 68-pin connector, even if that card presents a height profile that would otherwise prevent its use with an adjacent card. Finally, the wireless PC card should incorporate structural features which contribute to the reliability and durability of the antennae elements.

SUMMARY OF PRESENTLY PREFERRED EMBODIMENTS OF THE INVENTION

The present invention has been developed in response to the current state of the art, and in particular, in response to these and other problems and needs that have not been fully or adequately resolved by currently available wireless PC cards and devices. Briefly summarized, embodiments of the present invention provide a wireless PC card that materially improves the quality of wireless communication between the host device, in which the PC card is received, and one or more remote devices with which the host device is communicating.

Embodiments of the present invention are particularly well suited for use in the context of 32-bit CardBus-compliant host computers that are configured for compatibility with PCMCIA card form factors and that are employed in wireless computer networks. However, it will be appreciated that embodiments of the present invention may be suitable for use in conjunction with various other peripheral form factors, PC cards, computer systems, standards, networks, and devices including, but not limited to, devices using the 16-bit PC Card-compliant standard.

In one embodiment of the present invention, a wireless PC card for facilitating wireless communication is provided. The card includes an outer housing conforming to the PCMCIA form factor; in a preferred embodiment the housing has a thickness, or height, corresponding substantially to that specified by the PCMCIA Type II standard. The preferred PC card includes at least one extending portion, preferably a first and a second extending portion, that protrude outwardly from the host device when the wireless PC card is received in the PC card slot of the host. The first and second extending portions cooperatively define a recessed portion within the housing. The recessed portion has a predefined size and shape that is capable of accommodating at least a portion of an adjacent PC Card when that card is positioned within an adjacent connector slot. For example, in one preferred embodiment, the recess has a width that corresponds approximately to the width of two adjacent RJ-type modular connector bodies that are integrated within the housing of an adjacent card. In this way, the recess in the housing of the wireless PC card accommodates the two RJ-type modular connectors disposed and positioned on another PC card when that PC card simultaneously resides in a PC card slot adjacent to that of the wireless PC card.

Thus, the wireless PC card defines a housing geometry that permits the contemporaneous use of another PC card having one or more full height connectors that would otherwise preclude the presence of another card in an adjacent slot. Additionally, the recess collectively defined by the first and second extending portions of the wireless card housing can be used to house the antenna portions of the card, and therefore serve to maintain the antenna separation required for effective operation of the wireless PC card. Thus, preferred embodiments of the present invention serve to, among other things, improve the quality of wireless communication provided by the PC card. Additionally, the housing provides a durable enclosure which serves to protect the integrity of the antenna and thereby preserve the operability of the wireless PC card.

In preferred embodiments, first and second antenna are disposed in the first and second extending portions, respectively. The antennas can be any one of a number of antenna types depending on the wireless application, including but not limited to patch antennas, monopole antennas, etc. The wireless PC card additionally includes electronic circuitry disposed on a printed circuit board within the housing and in communication with the first and second antenna. Finally, a connector, preferably a PCMCIA standard 68-socket connector, in communication with the electronic circuitry and disposed at one end of the housing, is configured to slidingly mate with a corresponding 68-pin connector in the PC card slot of the host computer, so as to facilitate communication between the antennae and circuitry of the wireless PC card, and the host computer.

In operation, the wireless PC card is inserted in the PC card slot of the host computer so that the connector of the wireless PC card is releasably engaged by the connector of the PC card slot. In this way, the wireless PC card is physically and electrically connected to the host computer. By sending and receiving radio signals, the first and second antenna disposed in the wireless PC card facilitate wireless communication between the host computer and one or more remote devices of a wireless computer network.

These and other features and advantages of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

Reference will now be made to figures wherein like structures will be provided with like reference designations. It is to be understood that the drawings are diagrammatic and schematic representations of various embodiments of the claimed invention, and are not to be construed as limiting the present claimed invention, nor are the drawings necessarily drawn to scale.

Figure 1:
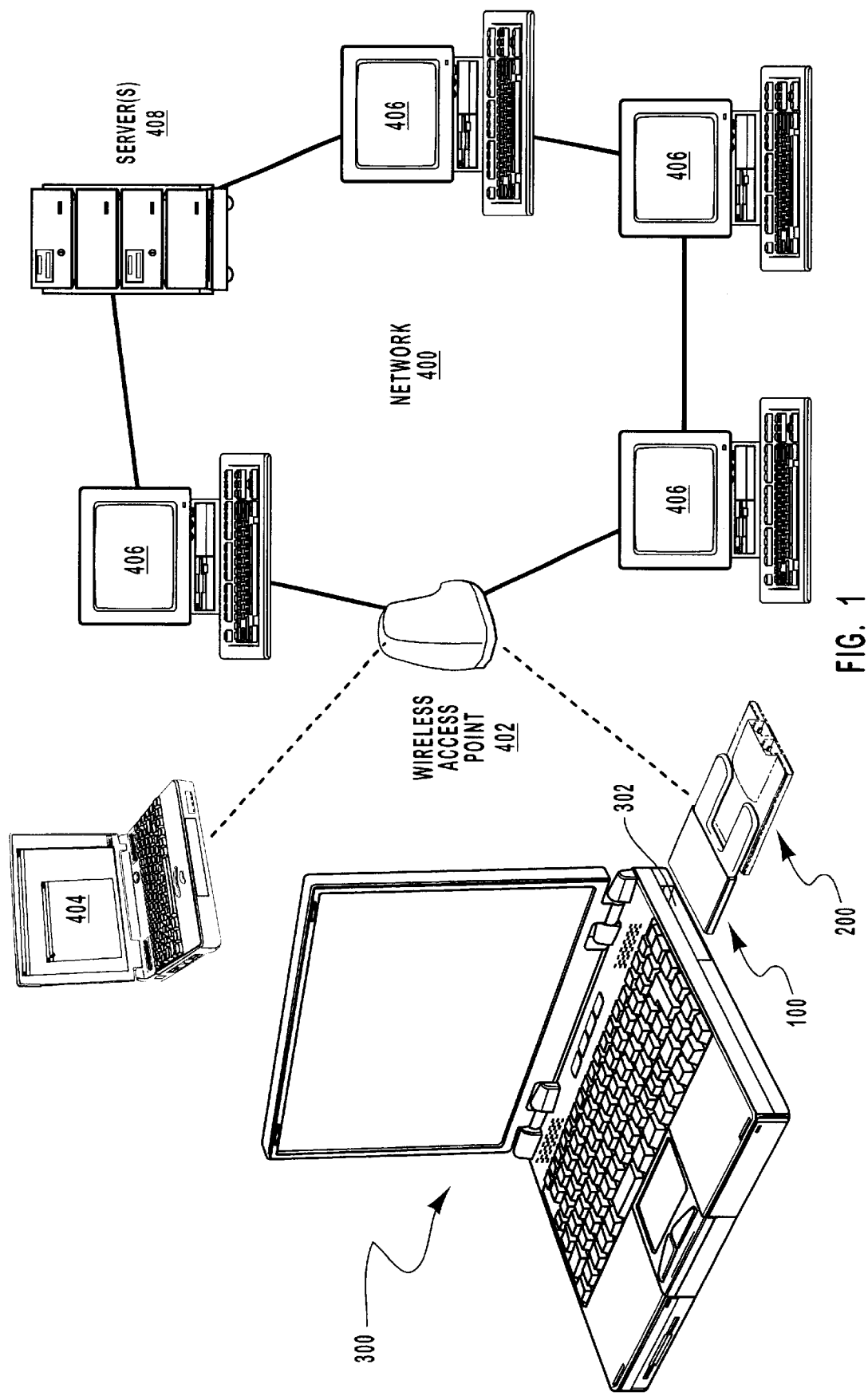
FIG. 1 illustrates an exemplary operating environment for embodiments of the present invention.

Reference is first made to FIG. 1, wherein one example of a wireless PC card is depicted generally at 100. As discussed in greater detail below, wireless PC card 100 may be used either alone or contemporaneously with another PC card, one example of which is shown at 200. It will be appreciated that PC card 200 may incorporate a wide variety of functionalities including, but not limited to, an add-on memory card, modem, network interface, or the like. In the illustrated embodiment, wireless PC card 100 conforms substantially to the physical dimensions of the Type II standard and PC card 200 conforms substantially to the Type II standard, but is equipped with a full height RJ-type modular connector body that exceeds the height limitations of the Type II specification, and corresponds to the height specified by the Type III standard. It will be appreciated that the scope of the present invention should not be construed to be limited solely to PC cards conforming to PCMCIA form factors, electrical parameters, and operational parameters. Rather, it will be appreciated that wireless PC card 100 and/or PC card 200 may be configured to individually and/or collectively conform to various other physical and electrical standards, form factors, and the like, as required to suit a particular application or hardware, and/or to facilitate achievement of one or more desired results.

As discussed below, both wireless PC card 100 and PC card 200 are configured to physically and electrically interface with a host device, such as computer 300, having an appropriately configured slot 302 or slots. It will be appreciated that host computer 300 may take on any of a variety of configurations including, but not limited to, a laptop computer or other type of portable computer, a standard desktop personal computer, a handheld PDA-type device, or any electronic device requiring wireless communication. In the illustrated embodiment, PC card slot 302 of host computer 300 conforms to the PCMCIA standard and is specifically configured to simultaneously receive two Type II PC cards, or single Type III card.

Host computer 300 in turn, communicates with wireless network 400 by way of RF signals wirelessly transmitted between wireless PC card 100 and a remote device, such as wireless access point 402 of wireless network 400. As discussed in further detail below, wireless access point 402 serves to facilitate wireless communication between host computer 300 and one or more other remote devices.

"Remote device" can refer to any device or system capable of engaging in wireless communication with host computer 300 by way of wireless PC card 100. Accordingly, it will be appreciated that "remote device" is not restricted solely to such devices as are typically employed in the context of a wireless computer network, but rather may include devices present or employed in various other contexts as well. Remote devices contemplated as being within the scope of the present invention include, but are not limited to, remote computers 404 and 406, telephones, wireless access point 402, wireless LAN components, and other systems and devices.

In addition to the wireless communication functionality supplied by wireless PC card 100, it will be appreciated that host computer 300 may additionally receive PC cards, such as embodiments of PC card 200, which would serve to facilitate, for example, "wired" communications between host computer 300 and any of a variety of other systems and remote devices, including, for example, a standard LAN and/or public telephone network.

With continuing reference to FIG. 1, additional details are provided regarding wireless network 400. While other standards could be used, in the illustrated embodiment the wireless network 400 comprises a wireless local area network (LAN) substantially conforming to the wireless LAN standard entitled *Wireless Standards Package* 802.11 and promulgated by the Institute of Electrical and Electronics Engineers (IEEE). One wireless LAN network conforming to the aforementioned standard and which provides a suitable environment for operation of embodiments of the present invention is the Wireless Fidelity, or Wi-Fi™, type network. The Wi-Fi™ certification for networks is awarded by the Wireless Ethernet Compatibility Alliance (WECA) and is characterized by various parameters, requirements, and the like relating to matters such as, but not limited to, interoperability of network components, and the frequency of radio communications to be employed in the network.

It will be appreciated that the Wi-Fi™ network standard simply represents one suitable operating environment for embodiments of the present invention, and that various other network standards may likewise be directed to wireless networks that represent suitable operating environments for embodiments of the present invention. Such other network standards include, but are not limited to, HomeRF® and Bluetooth™. It will further be appreciated that embodiments of the present invention are not limited solely to applicability in LANs, but are equally well suited for use in a variety of other types of wireless networks including, but not limited to, wide area networks (WAN) and the like.

Finally, note that, as contemplated herein, "wireless network" comprehends not only a network of computers configured for wireless communication, but also computer networks that include both computers configured for hardwire-based communication, "hardwired" computers, and computers configured for wireless communication, or "wireless" computers. The arrangement indicated in FIG. 1 is exemplary. It will be appreciated that a "wireless network" consistent with the teachings of the present invention may additionally include one or more hard-wired servers 408 in communication with host computers 406, as well as one or more wireless servers configured for wireless communication with wireless access point 402.

In operation, wireless PC card 100 facilitates wireless communications between host computer 300 and wireless network 400 by sending and/or receiving radio signals to/from wireless access point 402 of wireless network 400. As the specific nature of radio signal communication is well known in the art, a detailed discussion of such is neither required nor provided here. As discussed in further detail below, electronic circuitry, antennae, and various connectors in PC card 100 serve to implement communication between wireless PC card 100 and host computer 300. Wireless communication between host computer 300 and one or more remote devices, by way of wireless PC card 100, may be performed in response to input provided to host computer 300 by a user, and/or may be performed automatically according to various criteria embodied in hardware and/or software associated with host computer 300. Additionally, it will be appreciated that wireless communication with host computer 300 may be initiated by, or at, one or more remote devices, such as remote computers 404 and 406.

Upon receiving a radio signal from wireless PC card 100, wireless access point 402 relays the radio signal, in a manner well known in the art, to any of a variety of remote devices including, but not limited to, wireless LAN components (such as, but not limited to, wireless PC cards) located at remote computer 404, notebook systems, desktops, and other network components. Additionally, or alternatively, wireless access point 402 may relay the communication from wireless PC card 100 to one or more hardwired devices, such as remote computer 406 and/or server 408, connected to wireless access point 402. Of course, as noted elsewhere herein, wireless PC card 100 may also receive, by way of wireless access point 402, one or more radio signals from various remote devices such as remote computers 404 and 406.

Thus, wireless PC card 100, in conjunction with host computer 300, wireless network 400, and wireless access point 402, facilitates ready communication between host computer 300 and wireless network 400, without necessitating network infrastructure such as network ports, phone jacks, network cabling, network servers, and the like. Wireless PC card 100 also facilitates enhanced flexibility of wireless network 400 in that it permits host computer 300 to be moved at will to any location within radio communication of wireless access point 402.

Figure 2:
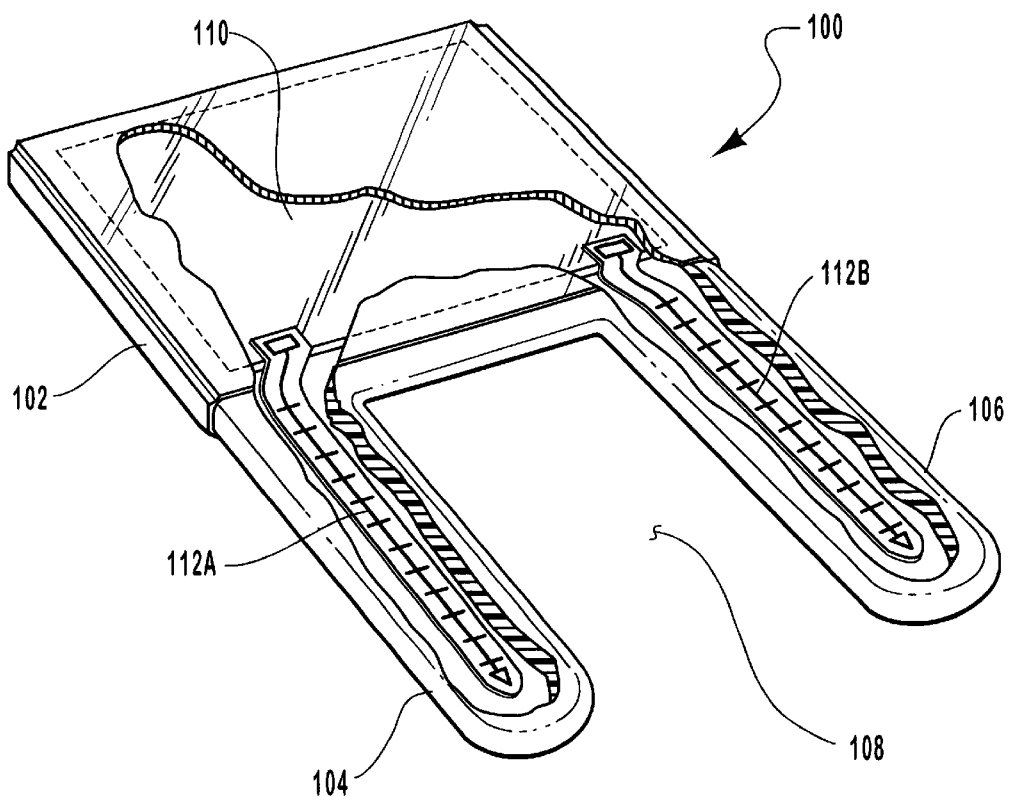
FIG. 2 is a front perspective view depicting various details of an embodiment of the present invention.
Figure 3:
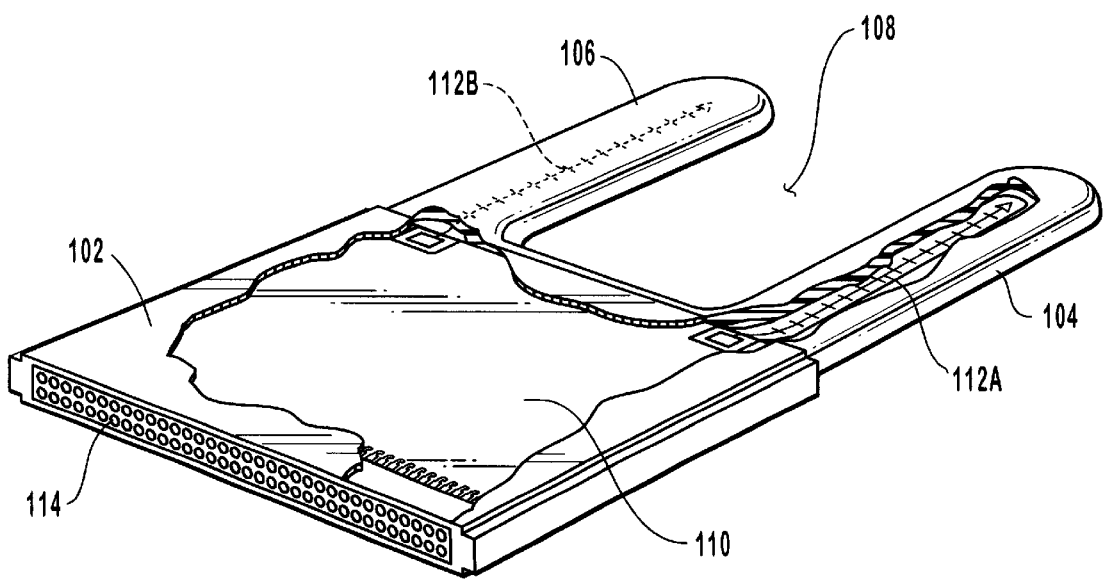
FIG. 3 is a rear perspective view depicting various details of an embodiment of the present invention.

Directing attention now to FIGS. 2 and 3, additional details are provided regarding various features of one presently preferred embodiment of a wireless PC card. In particular, wireless PC card 100 includes a main housing 102, which includes first and second extending portions 104 and 106, respectively. As suggested in FIG. 2, in a preferred embodiment the first extending portion 104 and second extending portion 106 of housing 102 are configured and arranged so they cooperate to define a recessed portion 108. Preferably, recess 108 is sized and configured to removably accommodate at least a portion of another PC card that is received within another adjacent slot. When the other PC card is so received, the two cards collectively conform to form a geometry, or form factor, that permits both cards to be operatively received with a card slot 302, and each interfaced with a standard 68-pin connector (not shown). That is, recess 108 is capable of accommodating a portion of the other PC card in a way that permits such other PC card to reside in PC card slot 302 at the same time as wireless PC card 100, and that allows both to interface with the host, such as two adjacent PCMCIA 68-pin electrical connectors (not shown). Note that specific details regarding one exemplary implementation of manner by which the wireless PC card 100 accommodates an adjacent card are discussed below in the context of FIGS. 4, 5 and 6. Finally, it will be appreciated that variables such as, but not limited to, the size, shape, and orientation of recess 108, as well as the number of recesses 108, may be adjusted, either alone or in various combinations, as required to suit a particular application and/or to facilitate achievement of one or more desired results.

By permitting the contemporaneous use of another adjacent PC card in PC card slot 302, wireless PC card 100, by way of recess 108, serves to enhance the operational flexibility of host computer 300. Wireless PC card 100 thus represents an advancement over known wireless PC cards which would not be able to simultaneously reside in a slot having a card that, for example, is equipped with an RJ connector receptacle that exceeds specified height limitations.

Directing continuing attention to FIGS. 2 and 3, the illustrated wireless PC card 100 additionally includes electronic circuitry 110 connected to antennae 112A and 112B disposed substantially within housing 102. In general, electronic circuitry 110 comprises circuits, devices, wiring, processors, integrated circuits, indicators, and the like necessary to implement the functionality of wireless PC card 100. In one embodiment of the present invention, visual indicators (not shown) are connected to antennae 112A and 112B and are disposed in first and second extending portions 104 and 106, respectively, so as to provide visual indication of the operational status of antennae 112A and 112B.

As indicated in FIG. 3, wireless PC card 100 further includes connector 114, preferably comprising a PCMCIA standard 68-socket configuration, which serves to physically connect wireless PC card 100 to a mating connector in PC card slot 302 of host computer 300 (not shown), as well as to electrically connect electronic circuitry 110 and antennae 112A and 112B to electronic circuitry disposed within host computer 300. It will be appreciated that connector 114 may take any of a variety of other forms as may be required for consistency and compatibility with the configuration of host computer 300, PC card slot 302, other hardware, and/or applicable electrical power constraints. Accordingly, the scope of the present invention should not be construed to be limited solely to PCMCIA 68-socket connectors.

Finally, it will be appreciated that a variety of means may be profitably employed to perform the functions, enumerated herein, of connector 114. Accordingly, connector 114 is but one example of a means for physically and electrically connecting wireless PC card 100 to host computer 300. It should be understood that the embodiment of connector 114 is presented herein solely by way of example and should not be construed as limiting the scope of the present invention in any way.

In fact, the functionality provided by connector 114 may be provided in any of a variety of different ways. As in the case of the illustrated embodiment, both the electrical connection and the physical connection functions may be performed by a single structural element. Alternatively, a means for physically and electrically connecting wireless PC card 100 to host computer 300 includes within its purview arrangements comprising one structure for electrically connecting wireless PC card 100 to host computer 300, such as a plurality of electrical contacts arranged for sliding surface engagement with mating contacts in PC card slot 302, and a separate structure for physically connecting wireless PC card 100 to host computer 300, such as locking tabs or the like.

Figure 4:
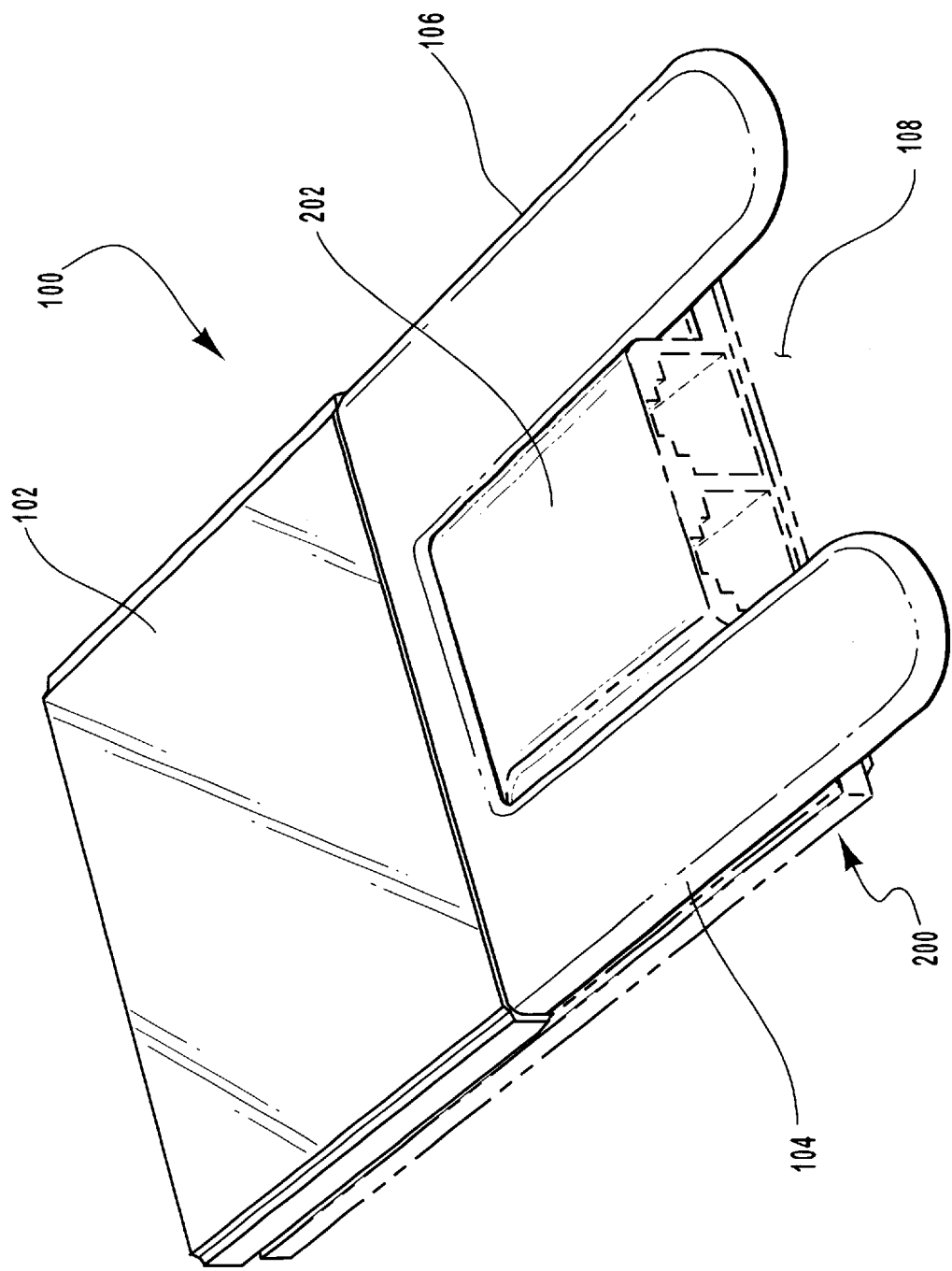
FIG. 4 is a front perspective view illustrating an exemplary application of an embodiment of the present invention.
Figure 5:
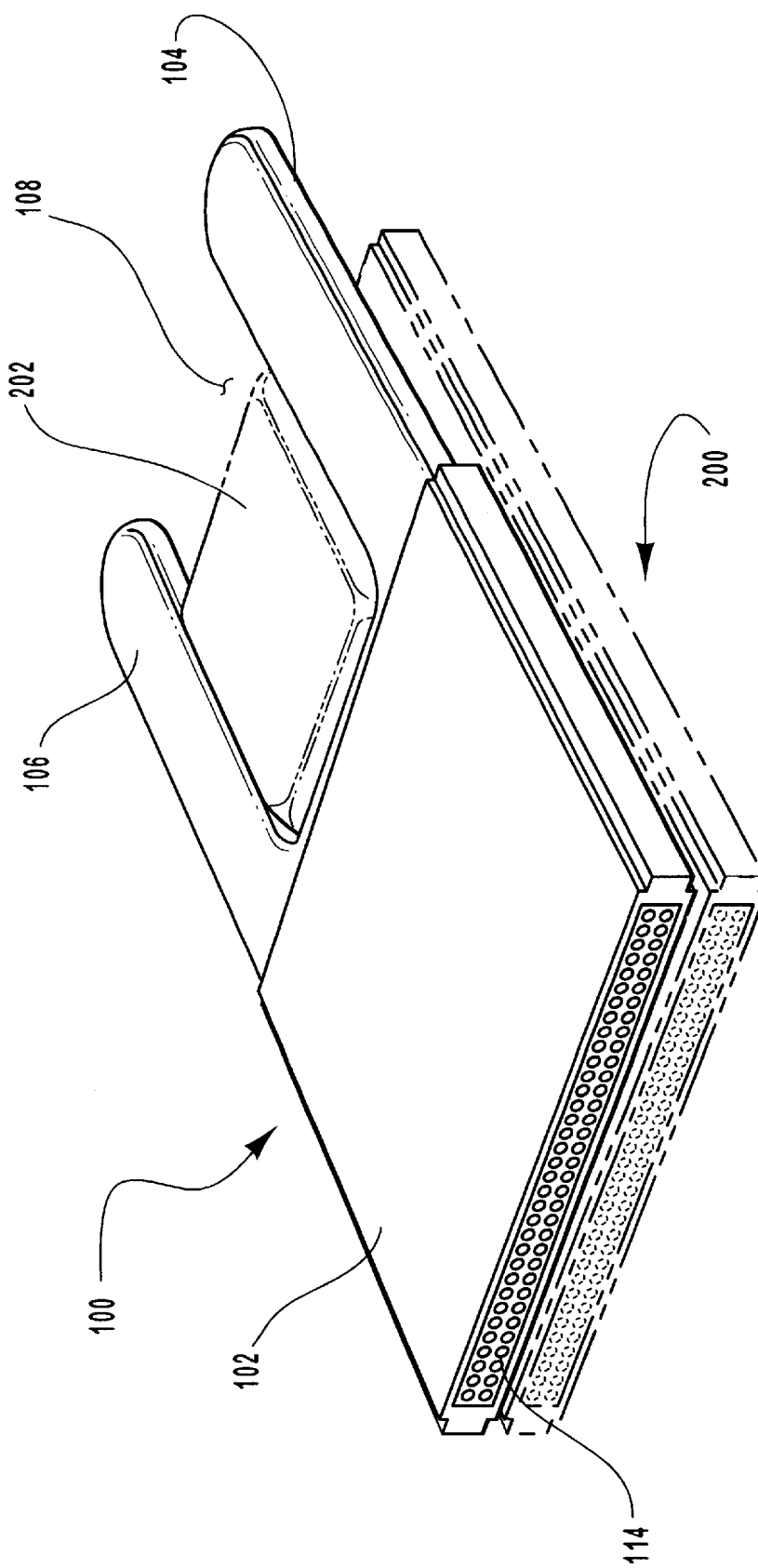
FIG. 5 is a rear perspective view of the exemplary application illustrated in FIG. 4.
Figure 6:
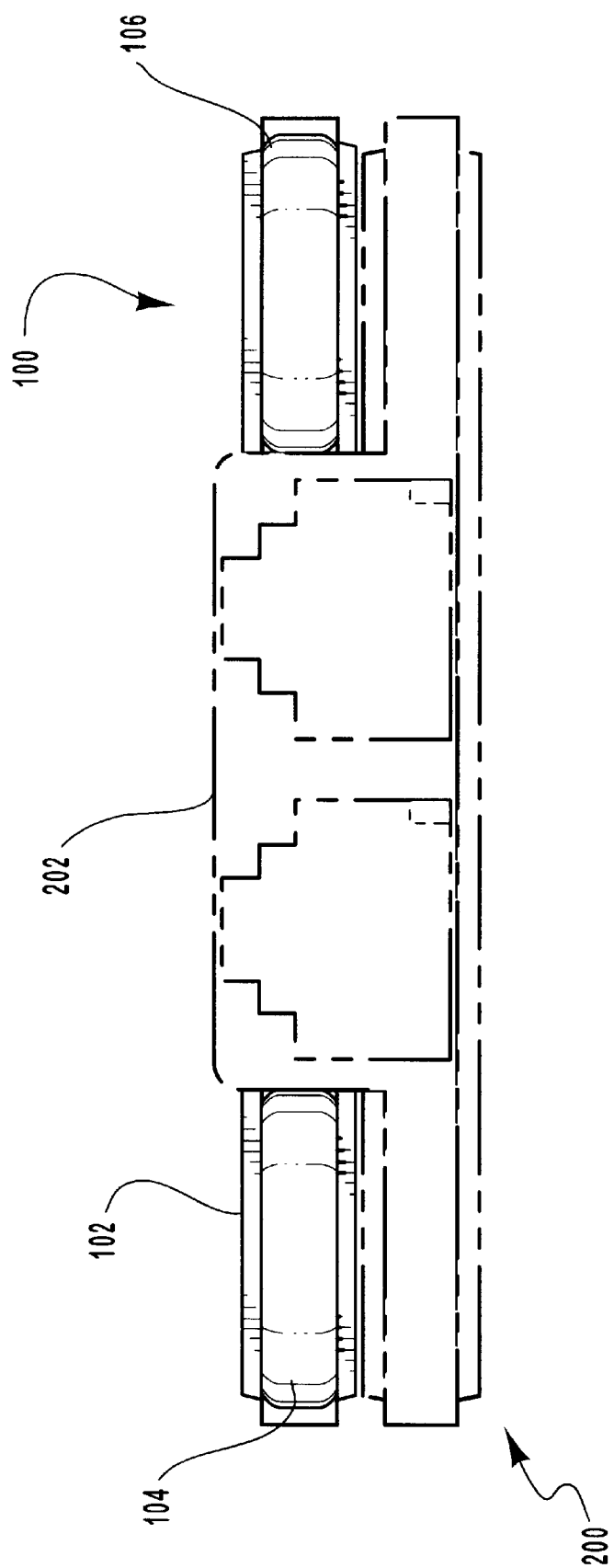
FIG. 6 is a front end view of the exemplary application illustrated in FIG. 4.

Directing attention now to FIGS. 4, 5 and 6, additional details regarding various features of an embodiment of wireless PC card 100 are provided. As discussed earlier in the context of FIGS. 2 and 3, recess 108 defined by first extending portion 104 and second extending portion 106 of housing 102 is generally configured and arranged to receive, or otherwise accommodate, a portion of a PC card 200, thereby permitting contemporaneous use of wireless PC card 100 and an adjacent PC card 200.

In one exemplary implementation, recess 108 defined by first extending portion 104 and second extending portion 106 of housing 102 and is configured and arranged to accommodate two RJ-type connector bodies, designated at 202, of PC card 200. Thus, in this configuration, wireless PC card 100 conforms to the Type II form factor and PC card 200, due to the presence of connector bodies 202, at least partially exceeds the physical constraints of the Type II specification, approximating more closely the Type III thickness. However, when arranged together in the exemplary configuration indicated in FIGS. 4, 5 and 6, wireless PC card 100 and PC card 200 can reside in adjacent connector slots. For example, the two cards together may provide outer physical dimensions that comply with the Type III standard.

Although some exemplary embodiments of the present invention are consistent with particular PCMCIA form factors, it will be appreciated that wireless PC card 100 may alternatively be configured so as to conform with various other form factors, both PCMCIA and/or others as well, either alone or when used in conjunction with PC card 200. While the illustrated embodiment of wireless PC card 100 is compatible for use with a PC card 200 having dual RJ-type connectors arranged in the center of PC card 200, it will be appreciated that various other embodiments of wireless PC card 100 may be employed that are suitable for use with PC cards 200 having different types, combinations, and/or arrangements of connectors.

Another feature relating to the operational flexibility facilitated by embodiments of wireless PC card 100 concerns the interaction between wireless PC card 100 and PC card 200 when it is desired to remove and/or replace PC card 200. Specifically, and as suggested by FIGS. 4 and 5, recess 108 of wireless PC card 100 is configured and arranged to permit PC card 200 to be readily removed and replaced without also necessitating the removal of wireless PC card 100. Thus, this feature enhances the operational flexibility of host computer 300 by permitting removal and/or replacement of PC card 200 without compromising the integrity of the wireless connection implemented by way of wireless PC card 100.

With continuing reference to FIGS. 4, 5 and 6, another useful feature of embodiments of wireless PC card 100 concerns the implications of the geometry of wireless PC card 100 with respect to the performance of antennae 112A and 112B. In particular, it was noted earlier that antennae 112A and 112B (FIG. 2) are respectively disposed in first extending portion 104 and second extending portion 106. Because first extending portion 104 and second extending portion 106 collectively define recess 108 therebetween, antennae 112A and 112B necessarily assume a spaced configuration with respect to each other. This spatially diverse antenna arrangement contributes to a material improvement in the performance of wireless PC card 100.

In particular, it is well known that the performance of antennae such as are employed in the context of embodiments of the present invention is at least partially a function of the magnitude of the separation between the respective antenna. It is generally the case that a relative increase in the distance between the antennae corresponds to a relative increase in the quality of the performance of the antennae. Thus, embodiments of the present invention represent an improvement over the prior art in that such embodiments are effective in establishing the antenna separation necessary for optimal performance of wireless PC card 100.

Not only is optimal antenna separation desirably achieved by embodiments of the present invention, but housing 102, specifically, first extending portion 104 and second extending portion 106, provides a durable enclosure for antennae 112A and 112B. Also, if desired, the arrangement permits the antennae 112A and 112B to extend a distance past the front of host computer 300. As discussed above, such an arrangement of antennae 112A and 112B may be necessary to ensure enhanced operation of wireless PC card 100. Also, the resistance of housing 102 to breakage and rough handling contributes significantly to the integrity of antennae 112A and 112B, and accordingly, to the usefulness and lifespan of wireless PC card 100.

To briefly summarize, embodiments of the present invention include a variety of useful and desirable features and advantages. For example, housing 102 of wireless PC card 100 is configured to enhance the quality of wireless communications achieved with wireless PC card 100 by establishing optimal separation of antennae 112A and 112B. Further, because housing 102 is configured to receive, or otherwise accommodate, a portion of another PC card 200, wireless PC card 100 and PC card 200 may contemporaneously reside in adjacent card slots of a host computer or similarly equipped device. Also, housing 102 is configured so that PC card 200 may be removed from PC card slot 302 without also necessitating the removal of wireless PC card 100. Thus, embodiments of the present invention operate both to enhance the operation flexibility of host computer 300, and to provide for a material improvement in the quality of wireless communications between host computer 300 and one or more remote devices.

It will be appreciated that the aforementioned features and advantages are presented solely by way of example. Accordingly, the foregoing should not be construed or interpreted to constitute, in any way, an exhaustive enumeration of features and advantages of embodiments of the present invention.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A peripheral device adapted to be electrically and physically received by a slot in a host device, the peripheral device comprising:
   (a) a main housing defining at least one recess, the at least one recess sized and shaped so to at least partially receive a portion of an outer housing of a second peripheral device residing in an adjacent slot position of the host device;
   (b) electronic circuitry substantially disposed within said main housing;
   (c) means for physically and electrically connecting the peripheral device to the host device when the peripheral is received within the slot; and
   (d) at least one antenna disposed in the main housing and electrically coupled to the electronic circuitry.

2. The peripheral device as recited in claim 1, wherein the peripheral device and the second peripheral device together define a thickness substantially similar to that defined by a Type III PCMCIA form factor when both devices are positioned adjacent to one another in the host device.

3. The peripheral device as recited in claim 1, wherein said main housing substantially conforms to a Type II PCMCIA form factor.

4. The peripheral device as recited in claim 1, wherein said main housing comprises first and second extending portions, said first and second extending portions cooperatively defining said recess.

5. The peripheral device as recited in claim 4, wherein the at least one antenna is substantially disposed in at least one of the extending portions.

6. The peripheral device as recited in claim 1, wherein said means for physically and electrically connecting the peripheral device to the host device comprises a PCMCIA electrical connector in electrical communication with said electronic circuitry.

7. For use in conjunction with a host computer including a PC card slot, a wireless PC card for facilitating communication between the host computer and a remote device, the wireless PC card comprising:
   (a) a housing defining a recess configured and arranged so that when said recess receives a portion of a connector body of another PC card, the wireless PC card and the another PC card collectively define a geometry compatible with the PC card slot;
   (b) two antennae disposed substantially within said housing on opposite sides of said recess;
   (c) electronic circuitry substantially disposed within said housing and being in communication with said two antennae; and
   (d) means for physically and electrically connecting the wireless PC card to the host computer.

8. The wireless PC card as recited in claim 7, wherein said recess is arranged and configured such that when the wireless PC card and the another PC card simultaneously reside in the PC card slot, said recess allows the another PC card to be removed from the PC card slot without requiring removal of the wireless PC card.

9. The wireless PC card as recited in claim 7, wherein said geometry comprises a PCMCIA form factor.

10. The wireless PC card as recited in claim 9, wherein said PCMCIA form factor comprises a Type III form factor.

11. The wireless PC card as recited in claim 7, wherein said housing substantially conforms to a PCMCIA Type II form factor.

12. The wireless PC card as recited in claim 7, wherein said housing comprises first and second extending portions, said first and second extending portions cooperatively defining said recess.

13. The wireless PC card as recited in claim 12, wherein one of said antennae is substantially disposed in said first extending portion and another of said antennae is substantially disposed in said second extending portion.

14. The wireless PC card as recited in claim 7, wherein said means for physically and electrically connecting the wireless PC card to the host computer comprises a standard PCMCIA sixty eight socket connector in electrical communication with said electronic circuitry.

15. A computer system configured for wireless communication with a remote device, the computer system comprising:
   (a) a host computer including a PC card slot; and
   (b) a wireless PC card, said wireless PC card being received in said PC card slot, and said wireless PC card comprising:
      (i) a housing defining a recess configured and arranged so that when said recess receives a portion of a connector body of another PC card, the wireless PC card and the another PC card collectively define a geometry compatible with said PC card slot;
      (ii) antennae disposed substantially within said housing on opposite sides of said recess;
      (iii) electronic circuitry substantially disposed within said housing and being in communication with said antennae; and
      (iv) means for connecting the wireless PC card to the client computer.

16. The computer system as recited in claim 15, wherein said PC card slot has a configuration consistent with a PCMCIA Type III form factor.

17. The computer system as recited in claim 15, wherein said geometry comprises a PCMCIA form factor.

18. The computer system as recited in claim 17, wherein said PCMCIA form factor comprises a Type III form factor.

19. The computer system as recited in claim 15, wherein said recess is arranged and configured such that when the wireless PC card and the another PC card simultaneously reside in said PC card slot, said recess allows the another PC card to be removed from said PC card slot without requiring removal of the wireless PC card.

20. The computer system as recited in claim 15, wherein said housing substantially conforms to a PCMCIA Type II form factor.

21. The wireless PC card as recited in claim 15, wherein said housing comprises first and second extending portions, said first and second extending portions cooperatively defining said recess.

22. The wireless PC card as recited in claim 21, wherein one of said antennae is substantially disposed in said first extending portion and another of said antennae is substantially disposed in said second extending portion.

23. A Type II wireless PC card for use in facilitating radio communication between a host computer including a Type III PC card slot, and a remote device, the Type II wireless PC card comprising:
   (a) a housing including first and second extending portions which cooperatively define a recess;
   (b) first and second antennae disposed in said first extending portion and said second extending portion, respectively;
   (c) electronic circuitry substantially disposed within said housing and being in communication with said first and second antennae; and
   (d) means for physically and electrically connecting the wireless Type II PC card to the host computer.

24. The Type II wireless PC card as recited in claim 23, further comprising a pair of visual indicators, one of said visual indicators being in communication with said first antenna and being substantially disposed in said first extending portion, and another of said visual indicators being in communication with said second antenna and being substantially disposed in said second extending portion.

25. The Type II wireless PC card as recited in claim 23, wherein said recess is configured and arranged so that when said recess receives a portion of a connector body of a Type III PC card, the wireless Type II PC card and the Type III PC card collectively conform to a Type II form factor.

26. The Type II wireless PC card as recited in claim 23, wherein said recess is configured and arranged so that at least a portion of a connector body of a Type III PC card is interposed between said first antenna and said second antenna when the wireless Type II PC card and the Type III PC card are simultaneously received in the Type III PC card slot, respectively.

* * * * *